United States Patent
Kalita et al.

(10) Patent No.: US 12,362,150 B2
(45) Date of Patent: Jul. 15, 2025

(54) SEMICONDUCTOR CHAMBER COMPONENTS WITH ADVANCED COATING TECHNIQUES

(71) Applicant: Applied Materials, Inc., Santa Clara, CA (US)

(72) Inventors: Laksheswar Kalita, Milpitas, CA (US); Joseph Behnke, San Jose, CA (US); Ryan Pakulski, Brentwood, CA (US); Christopher L. Beaudry, San Jose, CA (US); Jonathan Strahle, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 33 days.

(21) Appl. No.: 18/181,077

(22) Filed: Mar. 9, 2023

(65) Prior Publication Data

US 2024/0304423 A1 Sep. 12, 2024

(51) Int. Cl.
*H01J 37/32* (2006.01)
*C23C 16/40* (2006.01)
(Continued)

(52) U.S. Cl.
CPC ...... *H01J 37/32495* (2013.01); *C23C 16/405* (2013.01); *C23C 16/4404* (2013.01);
(Continued)

(58) Field of Classification Search
CPC ........... H01J 37/32495; H01J 37/32816; H01J 2237/0453; H01J 37/32477;
(Continued)

(56) References Cited

U.S. PATENT DOCUMENTS 9,583,369 B2 * 2/2017 Sun .......................... C23C 4/10
11,164,726 B2 * 11/2021 Matsumoto ....... H01J 37/32091
(Continued)

FOREIGN PATENT DOCUMENTS

| KR | 20220041439 A | 4/2022 |
| KR | 20220078723 A | 6/2022 |
| WO | 2021167897 A1 | 8/2021 |

OTHER PUBLICATIONS

Application No. PCT/US2024/010495, International Search Report and Written Opinion, Mailed on May 1, 2024, 10 pages.

*Primary Examiner* — Rudy Zervigon
(74) *Attorney, Agent, or Firm* — Kilpatrick Townsend & Stockton LLP

(57) ABSTRACT

The present technology is generally directed to semiconductor processing systems and methods. Systems and methods include a chamber having a plurality of chamber components, such as a pedestal, a lid stack, a faceplate, electrode, and a showerhead. The faceplate is supported with the lid stack and defines a plurality of first apertures and the showerhead is positioned between the faceplate and the pedestal and defines a plurality of second apertures. In systems and methods, the faceplate, the showerhead, the lid stack, the pedestal, or a combination thereof include an yttrium fluoride, yttrium oxyfluoride, or both yttrium fluoride and yttrium oxyfluoride coating having a thickness of greater than 10 μm on at least a portion of the respective chamber component or combination thereof.

15 Claims, 5 Drawing Sheets

(51) Int. Cl.
*C23C 16/44* (2006.01)
*C23C 16/455* (2006.01)
*C23C 16/458* (2006.01)
*C23C 16/50* (2006.01)
*C23C 16/56* (2006.01)

(52) U.S. Cl.
CPC .... *C23C 16/45565* (2013.01); *C23C 16/4583* (2013.01); *C23C 16/50* (2013.01); *C23C 16/56* (2013.01); *H01J 37/32816* (2013.01); *H01J 2237/0453* (2013.01)

(58) Field of Classification Search
CPC ............ H01J 37/3244; H01J 37/32449; C23C 16/405; C23C 16/4404; C23C 16/45565; C23C 16/4583; C23C 16/50; C23C 16/56; C23C 16/45561
USPC ........................ 118/715; 156/345.33, 345.34
See application file for complete search history.

(56) References Cited

U.S. PATENT DOCUMENTS

| | | | | |
|---|---|---|---|---|
| 2015/0147482 | A1* | 5/2015 | Kang | C23C 16/4404 427/535 |
| 2015/0311043 | A1* | 10/2015 | Sun | C23C 4/11 427/523 |
| 2015/0311044 | A1* | 10/2015 | Sun | C23C 14/221 427/527 |
| 2015/0321964 | A1* | 11/2015 | Sun | C23C 4/134 427/446 |
| 2019/0139743 | A1 | 5/2019 | Chen et al. | |
| 2019/0348261 | A1* | 11/2019 | Lin | H01L 21/6719 |
| 2020/0140996 | A1 | 5/2020 | Wu et al. | |

\* cited by examiner

SEMICONDUCTOR CHAMBER COMPONENTS WITH ADVANCED COATING TECHNIQUES

TECHNICAL FIELD

The present technology relates to semiconductor systems, processes, and equipment. More specifically, the present technology relates to systems including or forming coatings on chamber components.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Wet processes may also damage chamber components. For example, HF etchants may chemically attack chamber components made from metals, such as aluminum alloys. Dry etches produced in local plasmas formed within the substrate processing region can penetrate more constrained trenches and exhibit less deformation of delicate remaining structures. However, local plasmas may damage the substrate through the production of electric arcs as they discharge. Local plasmas, as well as plasma effluents, may also damage chamber components.

Thus, there is a need for improved systems and methods that can be used to produce high quality devices and structures. These and other needs are addressed by the present technology.

BRIEF SUMMARY

Embodiments of the present technology are generally directed to semiconductor processing systems. Systems include a chamber having a plurality of chamber components, such as a pedestal, a lid stack a faceplate, and a showerhead. In systems, a pedestal is configured to support a semiconductor substrate. In systems, the faceplate is supported with the lid stack and defines a plurality of first apertures. In embodiments, the showerhead is positioned between the faceplate and the pedestal and defines a plurality of second apertures. In systems, the faceplate, the showerhead, the lid stack, the pedestal, or a combination thereof include an yttrium fluoride, yttrium oxyfluoride, or both yttrium fluoride and yttrium oxyfluoride coating having a thickness of greater than 10 μm or less than about 100 nm on at least a portion of the respective chamber component or combination thereof.

In embodiments, the faceplate, the showerhead, or both the faceplate and the showerhead define a chamber facing surface have an exposed surface with an exposed surface area, where greater than or about 80% of the exposed surface area includes the yttrium fluoride, yttrium oxyfluoride, or both yttrium fluoride and yttrium oxyfluoride coating. In more embodiments, greater than or about 90% of the exposed surface area of the faceplate, showerhead, or both the faceplate and the showerhead include the yttrium fluoride, yttrium oxyfluoride, or both yttrium fluoride and yttrium oxyfluoride coating. Moreover, in embodiments, the yttrium fluoride, yttrium oxyfluoride, or both yttrium fluoride and yttrium oxyfluoride coating has a thickness of greater than or about 50 μm on at least a portion of the respective chamber component or combination thereof. Additionally or alternatively, in embodiments, the plurality of first apertures, the plurality of second apertures or a combination thereof define an aperture surface having an aperture surface area, where greater than or about 70% of the aperture surface area includes the yttrium fluoride, yttrium oxyfluoride, or both yttrium fluoride and yttrium oxyfluoride coating. In further embodiments, the yttrium fluoride, yttrium oxyfluoride, or both yttrium fluoride and yttrium oxyfluoride coating on the aperture surface further includes yttrium oxide, YOFx, or a combination thereof.

Embodiments of the present technology also include methods for coating components of a semiconductor processing chamber. Methods include positioning a component having an exposed surface within a chamber. Methods include depositing a coating that includes yttrium oxide on at least a portion of the exposed surface. Methods include exposing the coating to a high power plasma processing of greater than or about 2 watts of power and 500 millitorr pressure. Methods include where the high power plasma process includes flowing a fluorine-containing precursor into the chamber, forming a plasma from the fluorine-containing precursor to produce plasma effluents, and contacting the surface of the coating with the plasma effluents. Methods include converting at least a portion of the yttrium oxide in the coating to yttrium fluoride, yttrium oxyfluoride, or both yttrium fluoride and yttrium oxyfluoride.

In embodiments, the plasma further includes hydrogen, ammonia, helium, argon, or a combination thereof. In more embodiments, the fluorine-containing precursor includes nitrogen trifluoride. In further embodiments, methods include where the yttrium oxide is deposited by atomic layer deposition, plasma spray, e-beam, chemical vapor deposition, physical vapor deposition, plasma-enhance chemical vapor deposition, or a combination thereof. In more embodiments, the yttrium oxide is deposited by a combination of atomic layer deposition and plasma spray or e-beam. Additionally or alternatively, in embodiments, the component defines a plurality of apertures, each aperture having an exposed aperture surface, where the coating is deposited on at least a portion of the exposed aperture surfaces. In further embodiments, the high power plasma process includes a power of about 10 watts to about 3000 watts, a pressure of about 1 torr to about 15 torr, and a voltage of about 10 volts to about 1000 volts. In embodiments, the high power plasma process is conducted for a period of time sufficient to convert at least about 50 wt. % of the yttrium oxide to yttrium fluoride, yttrium oxyfluoride, or both yttrium fluoride and yttrium oxyfluoride. In further embodiments, the high power plasma process is conducted for at least about 1 hour. In even more embodiments, the high power plasma process is conducted for a period sufficient to provide the coating a thickness of greater than or about 1 μm.

Embodiments of the present technology are also generally directed to a method for coating one or more components of a semiconductor processing chamber. Methods include positioning a plurality of chamber components having an exposed surface in the semiconductor processing chamber. Methods include where the components are a faceplate that defines a plurality of first apertures and a showerhead that defines a plurality of second apertures. Methods include depositing a coating that includes yttrium oxide on at least a portion of the exposed surface of the plurality of chamber components. Methods include converting at least a portion of the yttrium oxide into an yttrium fluoride, yttrium oxyfluoride, or both yttrium fluoride and yttrium oxyfluoride in the semiconductor processing chamber.

In embodiments, the plurality of chamber components further includes a lid stack supporting the faceplate, and a pedestal configured to support a semiconductor substrate. In more embodiments, the method is performed under pressure. In further embodiments, the semiconductor processing chamber further includes a first electrode and a second electrode, where the first electrode and the second electrode are configured to provide at least about 2 watts of power during the converting.

Such technology may provide numerous benefits over conventional systems and techniques. For example, embodiments of the present technology may protect even hard to reach portions of chambers, such as increasingly small faceplate or showerhead apertures from any number of corrosive processes. Additionally, the coatings formed on the substrate supports and/or other components may be maintained for hundreds or thousands of wafers, due to the improved density of the coating, which may increase throughput, and also be maintained even in highly corrosive atmospheres. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
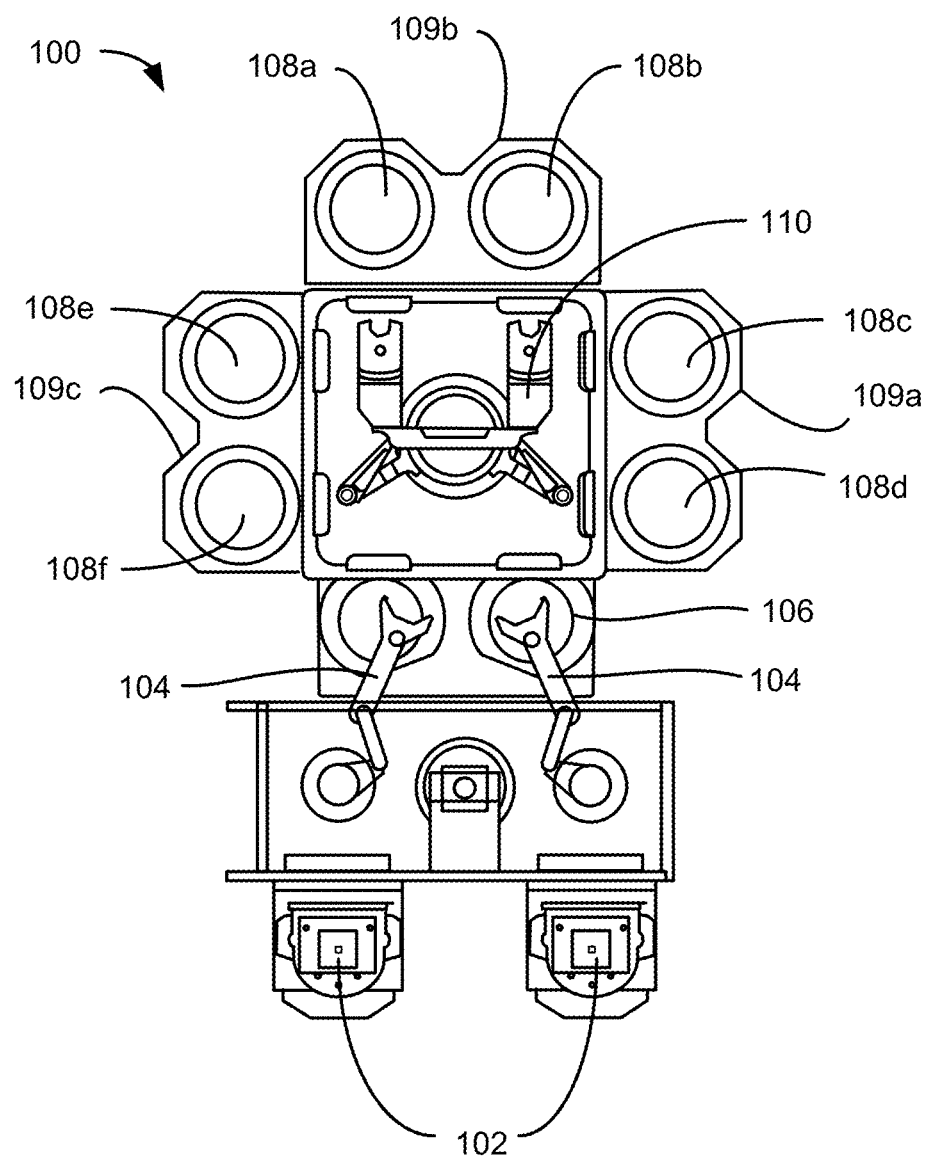
FIG. 1 shows a top plan view of an exemplary processing system according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Semiconductor processing may include a number of operations that produce intricately patterned material on a substrate. The operations may include a number of formation and removal processes, which may utilize corrosive or erosive materials, including plasma-enhanced materials formed either remotely or at the substrate level. While an etchant may preferentially etch the substrate material, the chemical etchant may also contact other components within the chamber. The etchant may chemically attack the components, and depending on the process performed, one or more of the components may be bombarded with plasma effluents, which may also erode materials. The chemical and physical damage to the chamber components caused by the etchant may cause wear over time, which may increase replacement costs and down time for the chamber, as well as potentially contaminate the chamber with chamber substrate-reactive species particles formed from erosion of chamber walls. As one non-limiting example, in some local or wafer-level plasma operations, a showerhead or manifold may operate as a ground electrode to develop plasma in the substrate processing region, where the substrate support or some other component may operate as the plasma-generating electrode. The showerhead operating as the ground electrode may be bombarded by plasma species, releasing metallic species that form the showerhead into the plasma, and potentially cause shorting during operation if such metallic contaminants contact the substrate. Deposition processes similarly may use plasma enhanced processes to form or deposit materials on substrates, which may also be deposited on chamber components.

Conventional technologies have struggled to limit both corrosion and erosion to chamber components and tend to replace components regularly due to the damage caused by one or both of these mechanisms. Accordingly, some conventional designs may routinely exchange the showerhead or coat the showerhead with a ceramic material that may resist the bombardment, such as an yttrium oxide based coating. Attempts have been made to improve ceramic based coatings using high quality deposition techniques, such as e-beam or plasma spray. However, while such coatings may operate sufficiently against some bombardment, or erosion, the do not sufficiently withstand a chemical reaction with plasma effluent species or contact with high energy plasma species. Namely, such exposure may still cause erosion and corrosion of the coating, particularly in areas where the coating is poorly formed or where high energy plasmas are present (e.g. capacitively coupled plasma).

Furthermore, such coatings may reduce an amount of process gasses or plasmas present, particularly during the first few substrates after initiation of the process. For instance, ceramic coatings, such as yttrium oxide based coatings, absorb plasma species and desorb hydrogen, causing the coating to flake and change composition after initial exposure to process plasmas. As a result, the deposited film properties on the first several substrates are significantly different from ideal, due to the coating interacting with the process plasma, which is often referred as the "first wafer effect".

Moreover, may chamber components include hard to access connections, holes, lid stacks, and the like as well as increasingly small features, such as showerheads and/or faceplates which include a number of apertures for delivering species through the chamber. If the coatings cannot completely coat every aperture sidewall and all exposed surfaces, plasma species that may be developed remotely may cause the same issues as species developed locally. Additionally, if the holes are not sufficiently small, local plasma may leak through these holes damaging other upstream components. However, when holes are formed sufficiently small, many line-of-sight coating devices are incapable of providing a complete coating within the holes. Thus, ceramic based coatings have struggled to sufficiently coat these small features, as deposition methods that yield high quality coatings, such as e-beam or plasma spray are inadequate at coating holes and features, particularly as they continue to decrease in size. In addition, such coating methods are limited in deposition thickness to coatings of less than 10 µm, which is not adequately thick or dense for many high energy processes. Attempts have been made to utilize atomic layer deposition (ALD) for improved coverage in small features. However, ALD is further restricted in deposition thickness, with coating thicknesses of yttrium oxide of 500 nm or less. Thus, existing chamber components have been incapable of long-term, stable operation in plasma environments, particularly in high energy environments.

The present technology overcomes these issues and others by coating chamber components prior to substrate processing with a high quality pre-halogenated coating. For example, chamber components may be completely coated on surfaces exposed within a semiconductor processing chamber. Additionally, the coatings may be characterized by increased thicknesses and/or density, which may improve both resistance to chemical systems and high powered plasma systems, as well as allowing the component to be used in processing a number of wafers before the coating is reapplied. Moreover, as the coating is already at least partially halogenated, the "first wafer effect" is greatly diminished, if not eliminated, removing the necessity for "seasoning" chambers and substrates. Furthermore, due to the unique methods presented herein, coatings according to the present technology may be applied in-situ within the assembled semiconductor processing chamber (e.g. chamber that will be utilized to process substrates). Thus, chambers and components therein may be easily re-coated without removing the unit from the processing stream. In addition, such processes allow for greater coverage of exposed surfaces of the chamber and components thereof reducing the surfaces at risk of corrosion and erosion during processing.

Although the remaining disclosure will routinely identify specific etching and deposition processes utilizing the disclosed technology, it will be readily understood that the systems and methods are equally applicable to deposition and cleaning processes and chambers as may occur in the described chambers or other chambers. Accordingly, the technology should not be considered to be so limited as for use with any particular etching processes or chambers alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f can be outfitted to perform a number of substrate processing operations including cyclical layer deposition (CLD), atomic layer deposition (ALD), chemical vapor deposition (CVD), physical vapor deposition (PVD), plasma-enhanced chemical vapor deposition (PECVD), etch, pre-clean, degas, orientation, and other substrate processes. The substrate processing chambers 108a-f may include one or more system components for depositing, annealing, curing and/or etching. Any one or more of the processes described herein may be carried out in chamber(s) separated from the fabrication system shown in different embodiments. It will be appreciated that additional configurations of chambers 108a-f are contemplated by system 100.

Figure 2A:
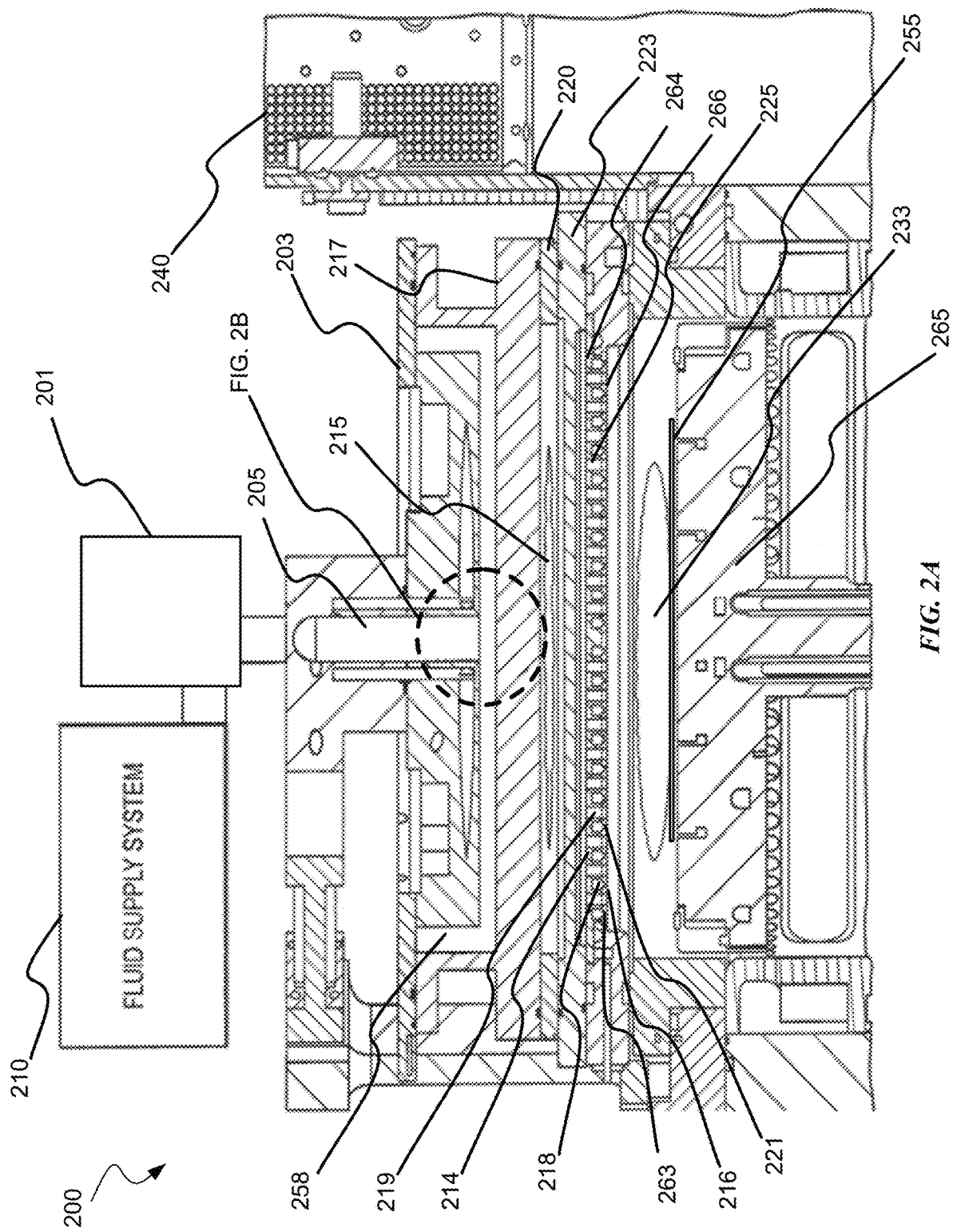
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During coating according to the present technology, a process gas may be flowed into the first plasma region 215 through a gas inlet assembly 205. A remote plasma system (RPS) 201 may optionally be included in the system and may process a first gas which then travels through gas inlet assembly 205. The inlet assembly 205 may include two or more distinct gas supply channels where the second channel (not shown) may bypass the RPS 201, if included.

Chamber components, such as a cooling plate 203, faceplate 217, ion suppressor 223, showerhead 225, and a pedestal 265, having a substrate 255 disposed thereon, are shown and may each be included according to embodiments. The cooling plate and faceplate may operate as aspects of a lid assembly, also referred to as a lid stack, in some embodiments. The pedestal 265 may have a heat exchange channel through which a heat exchange fluid flows to control the temperature of the substrate, which may be operated to heat and/or cool the substrate or wafer during processing operations. The substrate support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter the etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215 and/or substrate processing region 233. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225, or in both the chamber plasma region 215 and substrate processing region 233. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
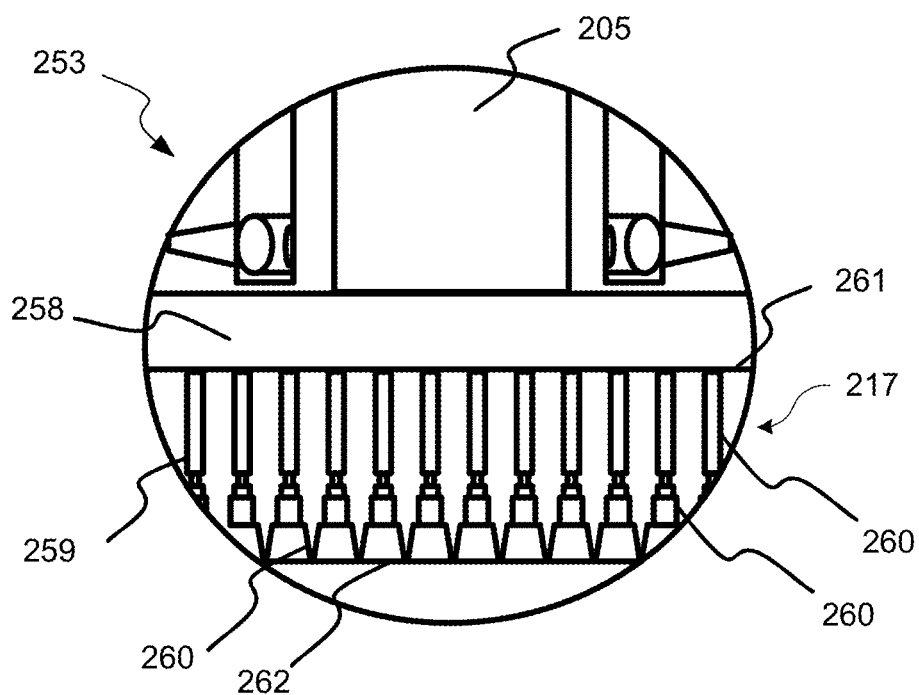
FIG. 2B shows a detailed view of a portion of the processing chamber illustrated in FIG. 2A according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233 but may be partially or fully prevented from backflow into the gas supply region 258 after traversing the faceplate 217.

As illustrated, faceplate 217 defines a plurality of apertures 259. While any shaped aperture 259 is contemplated, it should be clear that regardless of the shape, each aperture 259 defines an exposed aperture surface 260 extending around an interior of each aperture 259 from a first side 261 of faceplate 217 to a second side 262 of faceplate 217, that is exposed or in fluid connection with first plasma region 215 and gas inlet assembly 205. Moreover, in embodiments, the exposed aperture surface 260 of all apertures 259 may define an aperture surface area of faceplate 217.

Figure 3:
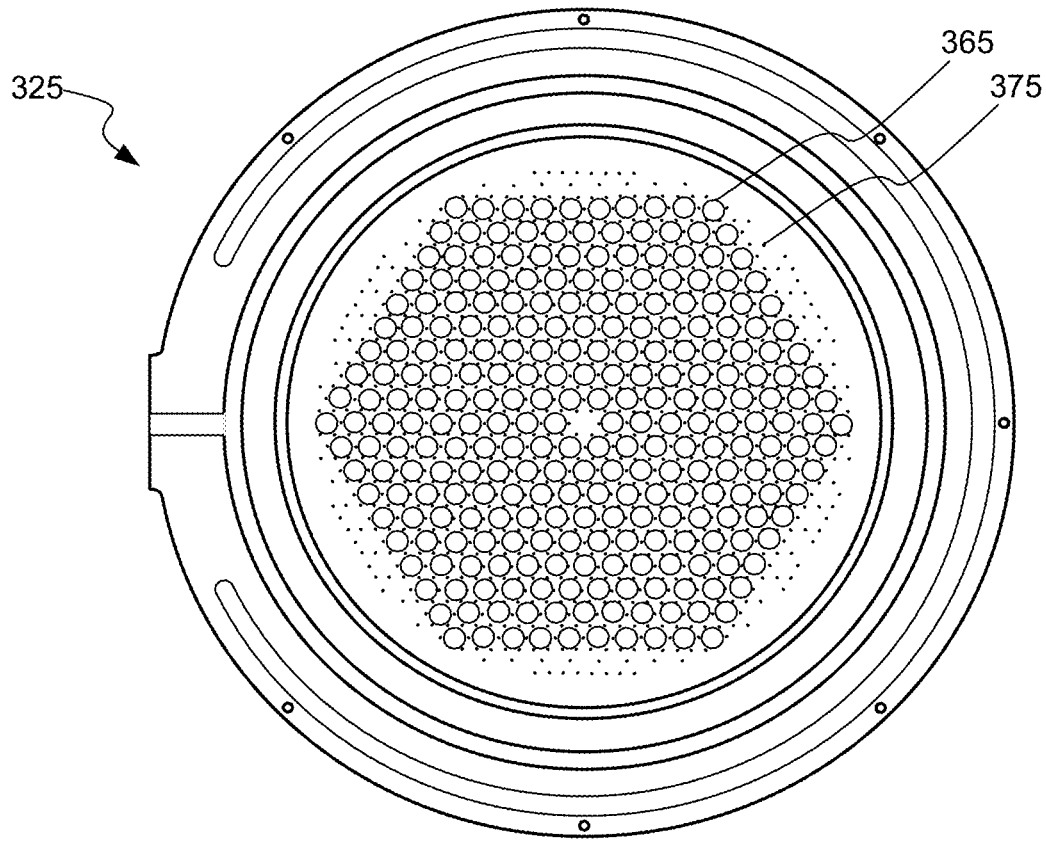
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first apertures 219 through the upper and lower plates, and second apertures 221 through the lower plate 216. The formed channels may be configured to provide fluid access from the volume 218 through the lower plate 216 via second apertures 221 alone, and the first apertures 219 may be fluidly isolated from the volume 218 between the plates and the second fluid channels 221. The volume 218 may be fluidly accessible through a side of the gas distribution assembly including showerhead 225. However, it should be understood that, in embodiments, only a single type of aperture 219 may be defined through showerhead 225, and/or apertures 219 and 221 may be collectively referred to as "showerhead apertures". Moreover, in embodiments, first apertures 219 and second apertures 221 may both extend fully or partially through showerhead 225 providing fluid access between first plasma region 215 and processing region 233. Furthermore, in embodiments, showerhead 225 may be formed from only one plate.

Nonetheless, as illustrated, showerhead 225 defines a plurality of apertures 219/221. While any shaped aperture 219/221 is contemplated, it should be clear that regardless of the shape, each aperture 219/221 defines an exposed aperture surface 263 extending around each aperture 219/221 from a first side 264 of showerhead 225 to a second side 266 of showerhead 225, that is exposed or in fluid connection with first plasma region 215 and processing region 233. Moreover, in embodiments, the exposed aperture surface 263 of all apertures 219/221 may define an aperture surface area of showerhead 225.

FIG. 3 is a bottom view of a showerhead 325 for use with a processing chamber according to embodiments. Showerhead 325 may correspond with the showerhead 225 shown in FIG. 2A. Through-holes 365, which show a view of first apertures 219, may have a plurality of shapes and configurations in order to control and affect the flow of precursors through the showerhead 225. Small holes 375, which show a view of second apertures 221, may be distributed substantially evenly over the surface of the showerhead, even amongst the through-holes 365, and may help to provide more even mixing of the precursors as they exit the showerhead than other configurations.

Figure 4:
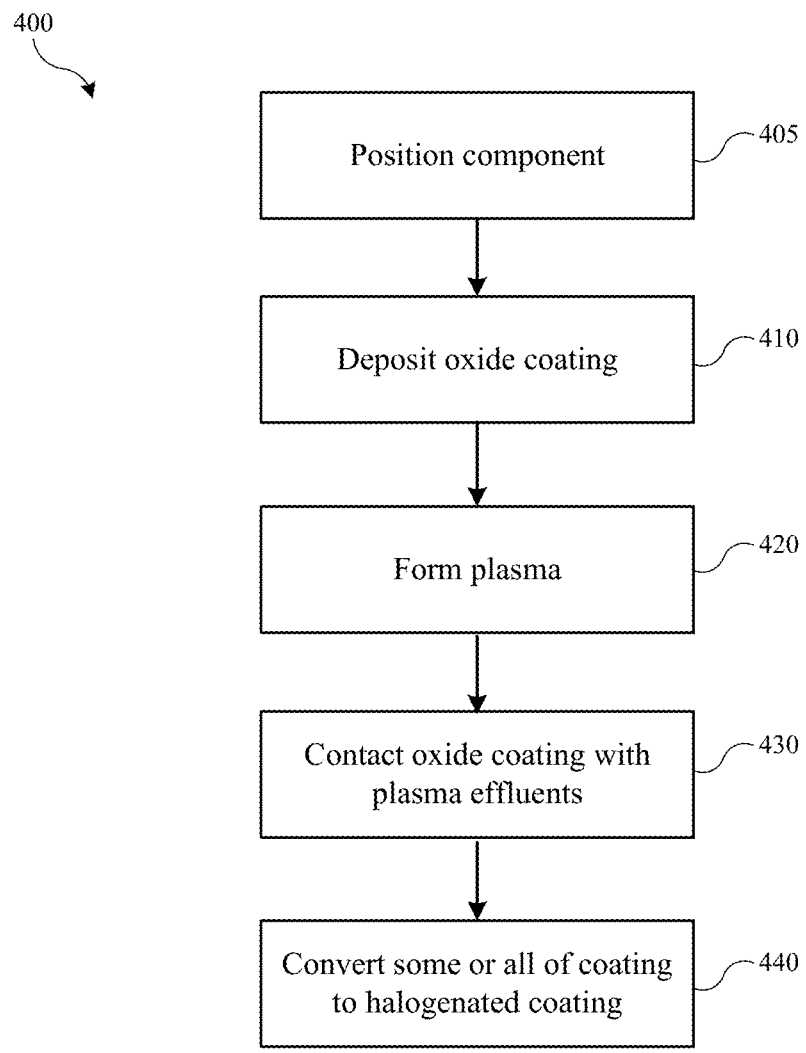
FIG. 4 shows exemplary operations in a method according to some embodiments of the present technology.

FIG. 4 shows exemplary operations in a method 400 according to some embodiments of the present technology. The method may be performed in a variety of processing chambers, including processing chamber 100 described above. Method 400 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 400 may include additional operations prior to initiation of the listed operations. For example, additional processing operations may include forming or providing chamber components. Prior processing operations may be performed in the chamber in which method 400 may be performed, or processing may be performed in one or more other processing chambers prior to delivering or installing the chamber component(s) into the semiconductor processing chamber in which method 400 may be performed. Regardless, method 400 may optionally include delivering one or more chamber components to a processing region of a semiconductor processing system 100, such as processing chamber 108a-f described above, or other chambers that may include components as described above. The chamber component(s) may be deposited within one or more process chambers 108a-f, such as a processing region 120 of the chamber described above. Method 400 describes operations shown schematically in FIGS. 5A-5C, the illustrations of which will be described in conjunction with the operations of method 400. It is to be understood that FIGS. 5A-5C illustrate only partial schematic views, and one or more chamber component(s) may include further components as illustrated in the figures, as well as alternative components, of any size or configuration that may still benefit from aspects of the present technology.

Figure 5A:
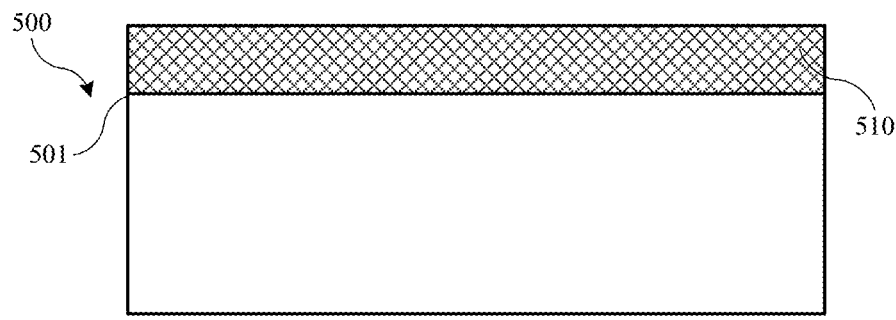
FIGS. 5A-5C show a schematic partial cross-sectional view of an exemplary chamber component according to some embodiments of the present technology.
Figure 5B:
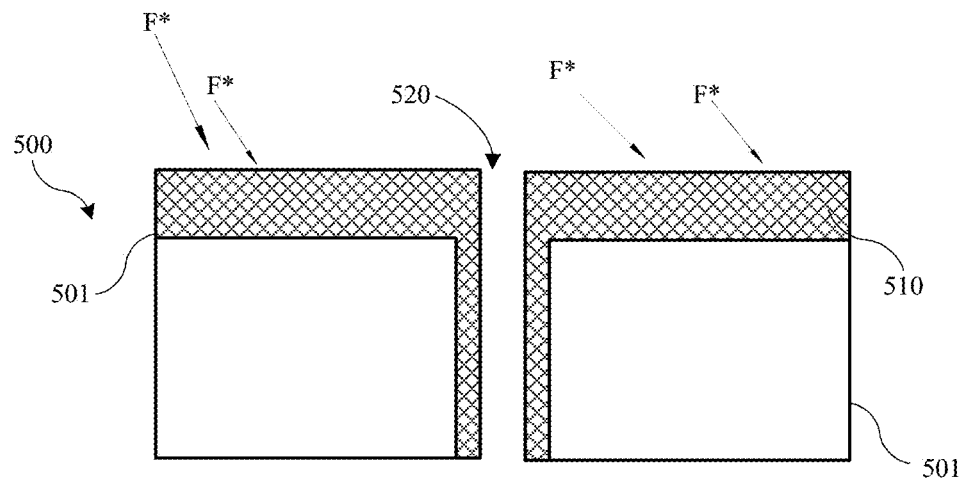
Figure 5C:
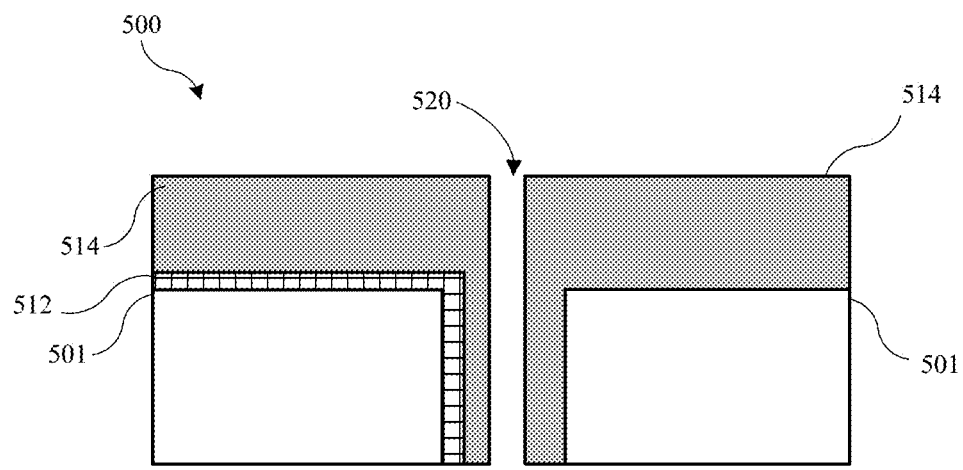

FIGS. 5A-5C illustrate a chamber component 500 that may be coated according to embodiments of the present technology. As discussed above, the chamber component 500 can be any one or more chamber components having a surface exposed to an interior of a semiconductor processing chamber, such as process system 100 or process chamber system 200 discussed above. Thus, in embodiments, the chamber component 500 can be one or more of a cooling plate 203, a faceplate 217, an ion suppressor 223, a showerhead 225, a pedestal 265 (alone or including s substrate support), and/or a baffle, supplies, inlets, outlets, and supports thereof, or the like. Namely, in embodiments, the chamber component 500 may be any one or more components used in a plasma processing chamber. In embodiments, the chamber component 500 may be assembled in a processing chamber 108a-f or a processing chamber of processing system 200 (e.g. for an in-situ process as will be discussed in greater detail below), or may be placed in a processing chamber 108a-f, such as on a support within a processing chamber (e.g. for an ex-situ process), at operation 405.

As illustrated in FIG. 5A, the chamber component 500 may include a surface 501. The exposed surface 501 may include a plurality of features, such as groves, apertures, features, or the like, depending upon the specific chamber component 500. In some embodiments, the chamber component 500 may include a plurality of apertures 520 (FIG. 5B), as discussed above, such as when chamber component 500 is a faceplate and/or a showerhead.

FIGS. 5A-5C show schematic cross-sectional views of exemplary corrosion and erosion resistant coatings deposited on a chamber component 500 according to some embodiments of the present technology. The figures provide exemplary views of various coating configurations intended to illustrate possible coating applications encompassed by embodiments of the present technology and may include coatings on a number of components in chamber system 200, or other components that may benefit from corrosion resistant coatings. It is to be understood that additional and alternative coating applications may be used during operation 410, which will be discussed in greater detail. The coating application, such as number of layers and type of layers formed, may depend on the type of component the coating is applied to and the configuration of the component. For example, if the component includes one or more apertures, the coating may include two or more layers or two or more applications (without forming a delineation between layers) of a ceramic material, such as yttrium oxide to provide complete coverage of the chamber component's exposed surface including the exposed surface of the respective aperture(s). The exemplary chamber component 500 provided in FIGS. 5A-5C may be an illustration of any of the chamber components previously described.

In some embodiments, the chamber component 500 may be made from aluminum, chromium, magnesium, nickel, alloys thereof, combinations thereof, or the like. Alloys often contain impurities of various alloying metals, even when the chamber component 500 contains high purity metal alloy. For example, aluminum alloys generally contain trace amounts of nickel, copper, iron, manganese, and chromium. In some embodiments, impurities may be present in aluminum alloys at the following atomic weight %: nickel ranging from about 0.001% to about 0.5%; iron ranging from about 0.001% to about 0.25 weight %; copper ranging from about 0.15% to about 0.35%; manganese ranging from about 0.001% to about 0.2%; zinc ranging from about 0.001% to about 0.15%; chromium ranging from about 0.04% to about 0.28%; titanium ranging from about 0.001% to about 0.06%, and magnesium ranging from about 0.8% to about 1.2%. Optionally, a total of other impurities present in the aluminum alloy may be about 0.15 weight % or less.

The illustration of FIGS. 5A-5C also includes a coating according to the present technology applied to an exposed surface 501 of chamber component 500. While the illustration only shows a coating applied to one surface of a chamber component, is to be understood that the coating may be included on all exposed surfaces (chamber facing surfaces, or surfaces exposed to the chamber, as discussed above) of the chamber component, and is shown as covering only the depicted surfaces for illustrative purposes. The corrosion and erosion resistant coating may be resistant to corrosion and erosion and be configured to protect component 500 from reactive etchants, including halogen-containing effluents, gases, etchants, or deposition treatments. For example, the corrosion and erosion resistant coating may be configured to protect component 500 from etchants or gases, even in high power processes, such as a CCP process.

Thus, in embodiments, an yttrium oxide containing coating 510 may be deposited on an exposed surface 501 of component 500 at operation 410. The yttrium oxide containing coating 510 may extend over an exposed surface 501 of component 500. As the yttrium oxide containing coating 510 is not the final coating of the present technology, there is no required thickness or expensive coating technique required. Namely, further operations that will be discussed in greater detail below are utilized to convert the coating to a halogen containing coating, which improves the thickness and/or density of the coating during conversion. Thus, in embodiments, the yttrium oxide containing coating 510 may be formed by a thermal spray method, an ALD method, a CVD method, a PVD method, a PECVD method, combinations thereof, or the like, as known in the art.

The a yttrium oxide containing coating 510 may extend about the chamber component 500 to achieve a coating thickness of greater than or about 5 nm, such as greater than or about 10 nm, such as greater than or about 50 nm, such as greater than or about 100 nm, such as greater than or about 250 nm, such as greater than or about 500 nm, such as greater than or about 750 nm, such as greater than or about 1 μm, such as greater than or about 2 μm, such as greater than or about 3 μm, such as greater than or about 4 μm, such as greater than or about 5 μm, such as greater than or about 6 μm, such as greater than or about 7 μm, such as greater than or about 8 μm, such as greater than or about 9 μm, such as up to 10 μm, or any ranges or values therebetween. Namely, as discussed above, and as known in the art, existing deposition methods for yttrium oxide are limited to less than 500 nm for ALD coating methods and less than 10 μm for e-beam methods, which are insufficient to protect against erosion and corrosion over long periods, in highly corrosive environments, and/or high energy plasma systems.

However, as noted above, the thickness of yttrium oxide containing coating 510 may not be critical, as the thickness and/or density may be improved according to the present technology. Nonetheless, in embodiments, when the chamber component 500 has small size features or apertures 520, two or more coating methods may be utilized in order to provide the yttrium oxide containing coating 510 over substantially all of an exposed surface of the chamber component or components. Namely, the present technology converts an underlying yttrium oxide containing coating 510 to a more robust halogen containing coating discussed below. Thus, the yttrium oxide containing coating 510 should be formed on all exposed surfaces where it is desired to form the halogenated coating of the present technology. Thus, in embodiments, e-beam, thermal spray, or the like may be utilized to form a high thickness and quality yttrium oxide containing coating 510 over a planar surface of the component (and/or line of sight exposed surface), and an ALD process or the like may be utilized to deposit over small features or apertures 520 (and/or non-line of sight exposed surfaces).

Regardless of the method(s) used, in embodiments, the exposed surface(s) of the one or more chamber components 500 may define an exposed surface area (e.g. the surface area of all exposed surfaces to be coated), where at least about 50% of the exposed surface area has the yttrium oxide containing coating 510 deposited thereon, such as greater than or about 60%, such as greater than or about 70%, such as greater than or about 80%, such as greater than or about 85%, such as greater than or about 90%, such as greater than or about 95%, such as greater than or about 97.5%, such as greater than or about 99%, or any ranges or values therebetween.

Moreover, as discussed above, it should be clear that when the chamber component or components include one or more plurality of apertures, the exposed aperture surface area is included in the chamber component(s) exposed surface area. Regardless, in embodiments, at least about 50% of an exposed aperture surface area, which may include the surface area of apertures of a faceplate, a showerhead, a combination thereof, or the like, may have a yttrium oxide containing coating 510 deposited thereon, such as greater than or about 60%, such as greater than or about 70%, such as greater than or about 80%, such as greater than or about 85%, such as greater than or about 90%, such as greater than or about 95%, such as greater than or about 97.5%, such as greater than or about 99%, or any ranges or values therebetween, such as illustrated in FIG. 5B.

In embodiments, the yttrium oxide may form all or a part of yttrium oxide containing coating 510, such as substantially all of yttrium oxide containing coating 510. In such embodiments, yttrium oxide may account for at least about 70 wt. % of yttrium oxide containing coating 510, based upon the weight of coating 510, such as greater than or about 75 wt. %, such as greater than or about 80 wt. %, such as greater than or about 85 wt. %, such as greater than or about 90 wt. %, such as greater than or about 92.5 wt. %, such as greater than or about 95 wt. %, such as greater than or about 97.5 wt. %, such as greater than or about 99 wt. % or any ranges or values therebetween. However, in embodiments, yttrium oxide containing coating 510 may include further constituents, such as minor amounts of fluorine (which may be present as fluorinated yttrium oxide, YOFx), carbon, or chamber contaminants such as aluminum, zirconium, or other similar materials, or other oxides in an amount of less than 50 wt. %, such as less than or about 40 wt. %, such as less than or about 30 wt. %, such as less than or about 20 wt. %, such as less than or about 10 wt. %, such as less than or about 5 wt. %, such as less than or about 2.5 wt. %, such as less than or about 1 wt. % of the yttrium oxide containing coating 510 includes non-yttrium oxide constituents.

After formation of yttrium oxide containing coating 510, a plasma may be formed to generate plasma effluents at operation 420. In some embodiments, a plasma may be formed in a remote plasma region within the chamber or fluidly coupled with the chamber and the plasma effluents generated from the remote plasma may be flowed into the processing region in accordance with the discussion above with reference to FIGS. 1-3 above. In some embodiments the plasma may be formed locally within the processing region and plasma effluents may be generated from the plasma within the processing region. Once the plasma effluents are generated, at operation 430, the surface of yttrium oxide containing coating 510 may be contacted with the plasma effluents.

The plasma generated at operation 420 may be, in some embodiments, a hydrogen containing plasma, a helium containing plasma, an ammonia containing plasma, an argon containing plasma, combinations thereof, or the like. Thus, in embodiments, secondary ions or radicals in the plasma are hydrogen, ammonia, helium, or argon containing plasma. Other types of secondary ions or radicals may also be used for method 400.

Nonetheless, regardless of the secondary ions and radicals present in the plasma, the present technology includes one or more halogen ions or radicals in the plasma. Thus, in embodiments, the method includes introducing a halogen containing precursor at operation 420. In embodiments, the halogen containing precursor is any precursor that generates fluorine radicals. In embodiment, the halogen containing precursor is a fluorine containing precursor. Moreover, in embodiments, the fluorine containing precursor is nitrogen trifluoride, $NF_3$.

Namely, the present technology has surprisingly found that when subjected to carefully controlled pressure and power, a fluorine containing plasma interacts with the oxygen rich yttrium oxide containing coating at operation 430 and as illustrated in FIG. 5B. Without wishing to be bound by theory, it is believed that the oxygen rich yttrium oxide containing coating 510 serves as a radical scavenger, interacting with the fluorine radicals present in the plasma. Through continued exposure to the plasma under high pressure and power, the yttrium oxide containing coating 510 is converted to an yttrium fluoride coating. $YF_3$ at operation 440 and as illustrated in FIG. 5C. This conversion provides multiple benefits. For instance, the conversion from yttrium oxide to yttrium fluoride increases the thickness and/or the density of the coating if desired, providing a more robust coating able to withstand stronger chamber environments, or components that exhibit a longer lifetime. In addition, the conversion to yttrium fluoride imparts the coating with fluorine within the coating itself. This minimizes or eliminates the first wafer effect, as the yttrium oxide coating is less, or not, susceptible to interaction with plasma process gasses.

The present technology provides a marked improvement over conventional chemical yttrium fluoride processes and deposition methods, as the coating of the present technology can be formed in-situ within the semiconductor processing chamber, allowing any exposed surface to be coated as it is presented in the chamber. Furthermore, for in-situ or ex-situ processes, the present technology allows for the formation of thicker and/or more dense coatings than conventional methods, as well as robust coating of even small features or apertures.

Thus, in embodiments, operations 420, 430, and/or 440 may be considered to be a high-power plasma process, and may therefore be conducted under conditions having a power of greater than or about 2 watts, such as greater than or about 5 watts, such as greater than or about 10 watts, such as greater than or about 25 watts, such as greater than or about 50 watts, such as greater than or about 75 watts, such as greater than or about watts, such as greater than or about 250 watts, such as greater than or about 500 watts, such as greater than or about 750 watts, such as greater than or about 1000 watts, such as greater than or about 1500 watts, such as greater than or about 2000 watts, such as greater than or about 2500 watts, such as up to about 3000 watts, or any ranges or values therebetween. Power may be provided as known in the art or as discussed above. Moreover, the high power plasma process is conducted at a pressure of greater than or about 500 millitorr, such as greater than or about 750 millitorr, such as greater than or about 1 torr, such as greater than or about 1.5 torr, such as greater than or about 2 torr, such as greater than or about 2.5 torr, such as greater than or about 3 torr, such as greater than or about 3.5 torr, such as greater than or about 4 torr, such as greater than or about 4.5 torr, such as greater than or about 5 torr, such as greater than or about 6 torr, such as greater than or about 7 torr, such as greater than or about 8 torr, such as greater than or about 9 torr, such as greater than or about 10 torr, such as greater than or about 11 torr, such as greater than or about 12 torr, such as greater than or about 13 torr, such as greater than or about 14 torr, such as up to about 15 torr, or any ranges or values therebetween. Pressure may be provided as known in the art or as discussed above.

Nonetheless, in embodiments, the high power plasma process may also include a voltage of greater than or about 10 V, such as greater than or about 25 V, such as greater than or about 50 V, such as greater than or about 75 V, such as greater than or about 100 V, such as greater than or about 125 V, such as greater than or about 150 V, such as greater than or about 200 V, such as greater than or about 250 V, such as greater than or about 300 V, such as greater than or about 350 V, such as greater than or about 400 V, such as greater than or about 450 V, such as greater than or about 500 V, such as greater than or about 600 V, such as greater than or about 700 V, such as greater than or about 800 V, such as greater than or about 900 V, such as up to about 1000 V, or any ranges or values therebetween.

Moreover, in embodiments, the high power plasma process may be conducted at high temperatures, such as a temperature above or about 30° C., above or about 50° C., above or about 75° C., above or about 100° C., above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher, or any ranges or values therebetween.

In embodiments, the high power plasma process may be conducted for a period of time sufficient to yield a yttrium fluoride containing coating thickness of greater than or about 10 nm, such as greater than or about 25 nm, such as greater than or about 50 nm, such as greater than or about 75 nm, such as greater than or about 100 nm, such as greater than or about 250 nm, such as greater than or about 500 nm, such as greater than or about 750 nm, such as greater than or about 1 µm, such as greater than or about 5 µm, such as greater than or about 10 µm, such as greater than or about 15 µm, such as greater than or about 20 µm, such as greater than or about 25 µm, such as greater than or about 50 µm, such as greater than or about 100 µm, such as greater than or about 150 µm, such as greater than or about 200 µm, such as greater than or about 250 µm, such as greater than or about 300 µm, such as greater than or about 350 µm, such as greater than or about 400 µm, such as greater than or about 450 µm, such as greater than or about 500 µm, or such as less than about 1000 nm, such as less than or about 900 nm, such as less than or about 800 nm, such as less than or about 700 nm, such as less than or about 600 nm, such as less than or about 500 nm, such as less than or about 400 nm, such as less than or about 300 nm, such as less than or about 200 nm, such as less than or about 100 nm, or any ranges or values therebetween. As noted above, in embodiments, the thickness of the yttrium fluoride containing coating may be increased from the thickness of the yttrium oxide coating, overall, or in one or more locations or on one or more components. Nonetheless, in embodiments, when desired the thickness of the yttrium fluoride containing coating may be generally equal to the thickness of the yttrium oxide coating overall, or in one or more locations or on one or more components.

For instance, in embodiments, the thickness of the coating may be relatively thin, but have an improved density. Thus, in embodiments, the density of the coating may be greater than or about 2 g/cm$^3$, such as greater than or about 2.25 g/cm$^3$, such as greater than or about 2.5 g/cm$^3$, such as greater than or about 2.75 g/cm$^3$, such as greater than or about 3 g/cm$^3$, such as greater than or about 3.5 g/cm$^3$, such as greater than or about 4 g/cm$^3$, such as greater than or about 4.5 g/cm$^3$, such as greater than or about 5 g/cm$^3$, such as greater than or about 5.5 g/cm$^3$, such as greater than or about 6 g/cm$^3$, such as greater than or about 6.5 g/cm$^3$, or any ranges or values therebetween.

Additionally or alternatively, in embodiments, the high power plasma process may be conducted for greater than or about 30 minutes, such as greater than or about 45 minutes, such as greater than or about 1 hour, such as greater than or about 1.5 hours, such as greater than or about 2 hours, such as greater than or about 2.5 hours, such as greater than or about 3 hours, such as greater than or about 3.5 hours, such as greater than or about 4 hours, such as greater than or about 4.5 hours, such as greater than or about 5 hours, or any ranges or values therebetween. However, as discussed above and as will be discussed below, in embodiments, the period of time the high power plasma process is conducted is based upon one or more factors which may depend upon the desired process chamber, chamber component, or the like, such as coating thickness, or percent conversion of the coating to yttrium fluoride.

For instance, in embodiments, it is hypothesized that a possible reaction method for a process according to the present technology may be:

$$4Y_2O_3 + 8F \rightarrow 8YOF + 2O_2$$
$$2YOF + 4F \rightarrow 2YF_3 + O_2$$

Thus, in embodiments, depending on the processing conditions and/or the time the conversion operation 440 is allowed to proceed, portions of chamber component 500 may contain a layer 512 that includes a fluorinated yttrium oxide, such as YOFx, as illustrated by FIG. 5C. While layer 512 is shown under yttrium fluoride containing coating 514, it should be understood that, in embodiments, layer 512 may be contained in discrete spots or locations through the entire thickness of yttrium fluoride containing coating 514, or may exist only in a feature, such as in aperture 520. Furthermore, in embodiments, layer 512 may also include unreacted yttrium oxide alone or in conjunction with fluorinated yttrium oxide. Thus, in embodiments, one or more apertures 520 may have a coating that is only partially converted, or that contains uncoated or yttrium oxide coated portions.

Nonetheless, in embodiments, it should be understood that the high power plasma process is conducted for a period of time sufficient to convert greater than or about 50 wt. % of the yttrium oxide in coating 510 to a yttrium fluoride, such as greater than or about 60 wt. %, such as greater than or about 70 wt. %, such as greater than or about 75 wt. %, such as greater than or about 80 wt. %, such as greater than or about 85 wt. %, such as greater than or about 90 wt. %, such as greater than or about 95 wt. %, such as greater than or about 97.5 wt. %, such as greater than or about 99 wt. %, or any ranges or values therebetween.

Moreover, in embodiments, the yttrium fluoride may form all or a part of yttrium fluoride containing coating 514, such as substantially all of yttrium fluoride containing coating 514. In such embodiments, yttrium fluoride may account for at least about 50 wt. % of yttrium fluoride containing coating 514, based upon the weight of coating 514, such as greater than or about 60 wt. %, such as greater than or about 70 wt. %, such as greater than or about 75 wt. %, such as greater than or about 80 wt. %, such as greater than or about 85 wt. %, such as greater than or about 90 wt. %, such as greater than or about 92.5 wt. %, such as greater than or about 95 wt. %, such as greater than or about 97.5 wt. %, such as greater than or about 99 wt. % or any ranges or values therebetween. However, in embodiments, yttrium fluoride containing coating 514 may include further constituents, such as minor amounts of YOFx, yttrium oxide, carbon, or other impurities (such as aluminum, zirconium, or other similar materials) in an amount of less than 50 wt. %, such as less than or about 40 wt. %, such as less than or about 30 wt. %, such as less than or about 20 wt. %, such as less than or about 10 wt. %, such as less than or about 5 wt. %, such as less than or about 2.5 wt. %, such as less than or about 1 wt. % of non-yttrium fluoride, or any ranges or values therebetween.

As noted above, the exposed surface(s) of the one or more chamber components 500 may define an exposed surface area (e.g. the surface area of all exposed surfaces to be coated), where at least about 50% of the exposed surface area has the yttrium fluoride containing coating 514 deposited thereon, such as greater than or about 60%, such as greater than or about 70%, such as greater than or about 80%, such as greater than or about 85%, such as greater than or about 90%, such as greater than or about 95%, such as greater than or about 97.5%, such as greater than or about 99%, or any ranges or values therebetween, as illustrated in FIG. 5C. Namely, it should be understood that, as used herein "formed thereon" or "deposited thereon" may include the yttrium fluoride coating being formed directly over chamber component 500, or may contain one or more intermediate layers between the yttrium fluoride coating and the chamber component, such as remaining yttrium oxide, or fluorinated yttrium oxide.

Furthermore, as discussed above, it should be clear that when the chamber component or components include one or more plurality of apertures, the exposed aperture surface area is included in the chamber component(s) exposed surface area. Regardless, in embodiments, at least about 50% of an exposed aperture surface area, which may include the surface area of apertures of a faceplate, a showerhead, a combination thereof, or the like, may have a yttrium fluoride containing coating 514 deposited thereon, such as greater than or about 60%, such as greater than or about 70%, such as greater than or about 80%, such as greater than or about 85%, such as greater than or about 90%, such as greater than or about 95%, such as greater than or about 97.5%, such as greater than or about 99%, or any ranges or values therebetween, such as illustrated in FIG. 5C.

Notwithstanding the process conditions selected, and as discussed above, it should be clear that, in embodiments, the present technology may be an "in-situ process". Such a process includes a process chamber that may be assembled with the necessary or desired chamber components for processing a substrate, and the chamber components are coated according to the present technology within the chamber that the chamber components themselves will ultimately be used to process substrates. Such a process may have additional advantages, such as ensuring that exposed surfaces are coated without unnecessarily coating covered or protected surfaces, in addition to the benefits discussed above. However, it should be clear that the present technology may also be used as an "ex-situ process", and still provide the benefits discussed above. In such a process, one or more components are loaded into a process chamber, coated according to the present technology, removed from the chamber, and then assembled in final process chamber in which the chamber components will be used to process a substrate. In embodiments, a chamber for coating a chamber component according to the present technology may be any process chamber in a processing system 100 or chamber system 200 discussed above. Nonetheless, in embodiments, the process chamber may be a CCP process chamber, a bias plasma chamber, or a combination thereof.

Corrosion and erosion resistant coatings formed according to the present technology may protect chamber components from chemical and plasma attack during processes, such as etching, deposition, and cleaning. The corrosion and erosion resistant coatings provided herein may reduce or eliminate the first wafer effect, as well as contamination of substrates with chamber component materials. Consequently, the present technology may improve device production, while additionally increasing component life within the processing chamber.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system comprising:
a chamber comprising a plurality of chamber components, the chamber components comprising:
a pedestal configured to support a semiconductor substrate;
a lid stack;
a faceplate supported with the lid stack, wherein the faceplate defines a plurality of first apertures; and
a showerhead positioned between the faceplate and the pedestal, wherein the showerhead defines a plurality of second apertures;
wherein the faceplate, the showerhead, the lid stack, the pedestal, or a combination thereof comprise an yttrium fluoride, yttrium oxyfluoride, or both yttrium fluoride and yttrium oxyfluoride, containing coating having a thickness of greater than 10 μm or less than about 100 nm on at least a portion of the respective chamber component or combination thereof and the coating comprises a density of greater than or about 2 g/cm$^3$.

2. The semiconductor processing system of claim 1, wherein the faceplate, the showerhead, or both the faceplate and the showerhead define an exposed surface having an exposed surface area, wherein greater than or about 80% of the exposed surface area comprises the yttrium fluoride, yttrium oxyfluoride, or both yttrium fluoride and yttrium oxyfluoride containing coating.

3. The semiconductor processing system of claim 2, wherein greater than or about 90% of the exposed surface area of the faceplate, the showerhead, or both the faceplate and the showerhead comprise the yttrium fluoride, yttrium oxyfluoride, or both yttrium fluoride and yttrium oxyfluoride containing coating.

4. The semiconductor processing system of claim 1, wherein the yttrium fluoride, yttrium oxyfluoride, or both yttrium fluoride and yttrium oxyfluoride containing coating has a thickness of greater than or about 50 μm on at least a portion of the respective chamber component or combination thereof.

5. The semiconductor processing system of claim 1, wherein the plurality of first apertures, the plurality of second apertures, or a combination thereof define an aperture surface having an aperture surface area, wherein greater than or about 70% of the aperture surface area comprises the yttrium fluoride, yttrium oxyfluoride, or both yttrium fluoride and yttrium oxyfluoride containing coating.

6. The semiconductor processing system of claim 5, wherein the yttrium fluoride, yttrium oxyfluoride, or both yttrium fluoride and yttrium oxyfluoride containing coating on the aperture surface further comprises yttrium oxide, YOFx, or a combination thereof.

7. The semiconductor processing system of claim 2, wherein the exposed surface comprises a plurality of features.

8. The semiconductor processing system of claim 7, wherein the plurality of features comprise an exposed feature surface area, wherein greater than or about 50% of the exposed feature surface area comprises the coating.

9. The semiconductor processing system of claim 1, wherein the faceplate, the showerhead, the lid stack, the pedestal, or a combination thereof are formed from an aluminum alloy.

10. The semiconductor processing system of claim 1, wherein the coating comprises a thickness from about 5 nm to about 100 nm.

11. The semiconductor processing system of claim 1, wherein the faceplate comprises the coating.

12. The semiconductor processing system of claim 1, wherein the showerhead comprises the coating.

13. The semiconductor processing system of claim 1, wherein the lid stack comprises the coating.

14. The semiconductor processing system of claim 1, wherein the pedestal comprise the coating.

15. The semiconductor processing system of claim 1, wherein the coating comprises a thickness from about 20 μm to about 200 μm.

\* \* \* \* \*